US 6,688,453 B2

(12) United States Patent
Alviar et al.

(10) Patent No.: US 6,688,453 B2
(45) Date of Patent: Feb. 10, 2004

(54) RAILING FOR A BOAT CONVEYOR SYSTEM

(75) Inventors: Melvin B. Alviar, Baguio (PH); Ramil A. Viluan, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/035,097

(22) Filed: Dec. 27, 2001

(65) Prior Publication Data

US 2003/0121757 A1 Jul. 3, 2003

(51) Int. Cl.[7] ................... B65G 15/00; B65G 37/00; B65G 43/00; B65G 21/20; B65G 17/00
(52) U.S. Cl. ..................... 198/346.1; 198/836.1
(58) Field of Search ............. 198/346.1, 836.1, 198/836.3, 860.1

(56) References Cited

U.S. PATENT DOCUMENTS

| 935,669 | A | * | 10/1909 | Logan | 193/35 C |
| 5,411,358 | A | * | 5/1995 | Garric et al. | 414/277 |
| 5,911,306 | A | * | 6/1999 | Ferrari | 198/836.1 |
| 5,971,137 | A | * | 10/1999 | Grant et al. | 198/860.1 |
| 6,152,293 | A | * | 11/2000 | Ballos, III | 198/836.3 |
| 6,196,375 | B1 | * | 3/2001 | Cozza | 198/836.1 |
| 6,308,818 | B1 | * | 10/2001 | Bonora et al. | 198/465.1 |

* cited by examiner

Primary Examiner—Gene O Crawford
(74) Attorney, Agent, or Firm—Wade James Brady, III; Frederick J. Telecky, Jr.

(57) ABSTRACT

A conveyor system (30) comprises: a boat (20), a feed belt (36), a feed pulley (38), and improved railings (34). The boat (20) is adapted to carry a component or components, such as semiconductor chips (32), therein. The feed belt (36) is driven by the feed pulley (38). The feed belt (36) is adapted to move the boat (20) along the conveyor system (30). The improved railings (34) are adapted to retain the boat (20) and to define a path for the boat (20). A set of bearings (44) are coupled to each of the improved railings (34) in locations such that the boat (20) will contact the bearings (44) rather than the railings (34) for at least part of the path as the boat (20) moves along the conveyor system (30).

10 Claims, 3 Drawing Sheets

RAILING FOR A BOAT CONVEYOR SYSTEM

FIELD OF THE INVENTION

The present invention relates to an improvement in a railing for a boat conveyor system in a production line.

BACKGROUND

In a mass production fabrication line where parts are transported and indexed for a series of fabrication steps, it is typically highly desirable to reduce or eliminate downtime in the production line. Because many production lines run all the time (i.e., 24 hours per day and 7 days per week) to keep up with production demands and to maximize the use of each machine, even small amounts of repeated downtime can add up to large expenses due to less efficiency. There can be many different causes of downtime, and thus there is often a continual search for anything that may cause down time so that a solution may be found to reduce or eliminate such downtime. Hence, ways to reduce downtime in a production line are highly desirable.

Another economic consideration for production lines is the life of a part or machine. In general, the more life that can be obtained from a given machine can translate into lower capital expenses, leaving room for higher profit margins. Thus, there is often a continual need or search for ways to make parts and equipment last longer, especially in a mass production line.

In the production of semiconductor devices or electronic devices for example, a part or system being fabricated is often transported from one station to another on a "boat." A "boat" in this context is a carriage tray designed to hold a wafer, part, component, or system being produced, and designed to fit within and to be moved by an indexing conveyor system. Sometimes a boat is designed to hold a component firmly and/or in a precise position, whereas some boats merely provide one or more slots or indentations for loosely carrying a component to a subsequent station. FIG. 1 shows an example of a boat 20 used in packaging processes during the production of semiconductor devices. The boat 20 shown in FIG. 1 has an array of cavities 22 formed therein adapted to hold semiconductor chips during packaging processes. During production, indexing the boat 20 with a conveyor system is often used to align the component or system for the next step of fabrication. Hence, if or when the indexing for a station or stations gets out of alignment or gets shifted, it can cause indexing downtime for corrections. Thus, there is a need for a way to decrease indexing downtime in a production line.

One problem that may be a cause of premature part wear and/or indexing errors is friction in the boat conveyer system. Therefore, there is often a need to identify or locate such friction areas and to eliminate or reduce such friction problems.

BRIEF SUMMARY OF THE INVENTION

The problems and needs outlined above are addressed by the present invention. In accordance with one aspect of the present invention, a conveyor system is provided, which comprises: a boat, a railing, and a bearing. The railing is adapted to retain the boat and to define at least part of a path for the boat as it moves along the conveyor system. The bearing is coupled to the railing at a location so that the boat will contact the bearing rather than the railing for at least part of the path as the boat moves along the conveyor system.

In accordance with another aspect of the present invention, a conveyor system is provided, which comprises: a boat, a feed belt, a feed pulley, and railings. The boat is adapted to carry a component therein. The feed belt is driven by the feed pulley. The feed belt is adapted to move the boat along the conveyor system. The railings are adapted to retain the boat and to define a path for the boat. A set of bearings are coupled to each of the railings in locations such that the boat will contact the bearings rather than the railings for at least part of the path as the boat moves along the conveyor system.

In accordance with yet another aspect of the present invention, an improved railing for a conveyor system is provided. The improved railing comprises a set of bearings coupled to the railing and extending from the railing. The bearings are adapted to provide rolling surfaces for a boat that is restrained by the railing as the boat moves along the conveyor system.

In accordance with still another aspect of the present invention, a method of producing an electronic component is provided. The method comprises the steps of: (i) providing a conveyor system comprising: (a) a boat adapted to carry the electronic component therein, (b) a feed belt driven by a feed pulley, the feed belt being adapted to move the boat along the conveyor system, (c) a railing to retain the boat and to define a path for the boat, and (d) a set of bearings coupled to the railing in locations such that the boat will contact the bearings rather than railing for at least part of the path as the boat moves along the conveyor system; (ii) moving the boat from one location to another location with the feed belt; and (iii) directing the path of the boat with the bearings.

In accordance with another aspect of the present invention, a method of improving a conveyor system that is adapted to move a boat along a path defined by one or more railings using a feed belt is provided. The method comprises the step of replacing at least some of the one or more railings with one or more improved railings, wherein the one or more improved railings each comprises a set of bearings coupled to and extending from the improved railing in locations such that the boat will contact the bearings rather than the railing along at least part of the path defined by the one or more railings as the boat moves along the conveyor system. The method may further comprise the steps of: reducing friction between the boat and the one or more railings as the boat moves along the conveyor system as a result of the replacing at least some of the one or more railings step; and reducing wear between the boat and the one or more railings due to the reducing friction step. The method may further comprise the steps of: reducing indexing errors during the step of moving the boat from one location to another location, as a result of the replacing at least some of the one or more railings step; and reducing indexing downtime during production as a result of the reducing indexing error step.

BRIEF DESCRIPTION OF THE DRAWINGS

Other objects and advantages of the invention will become apparent upon reading the following detailed description and upon referencing the accompanying drawings, in which.

DETAILED DESCRIPTION OF THE INVENTION

Figure 1:
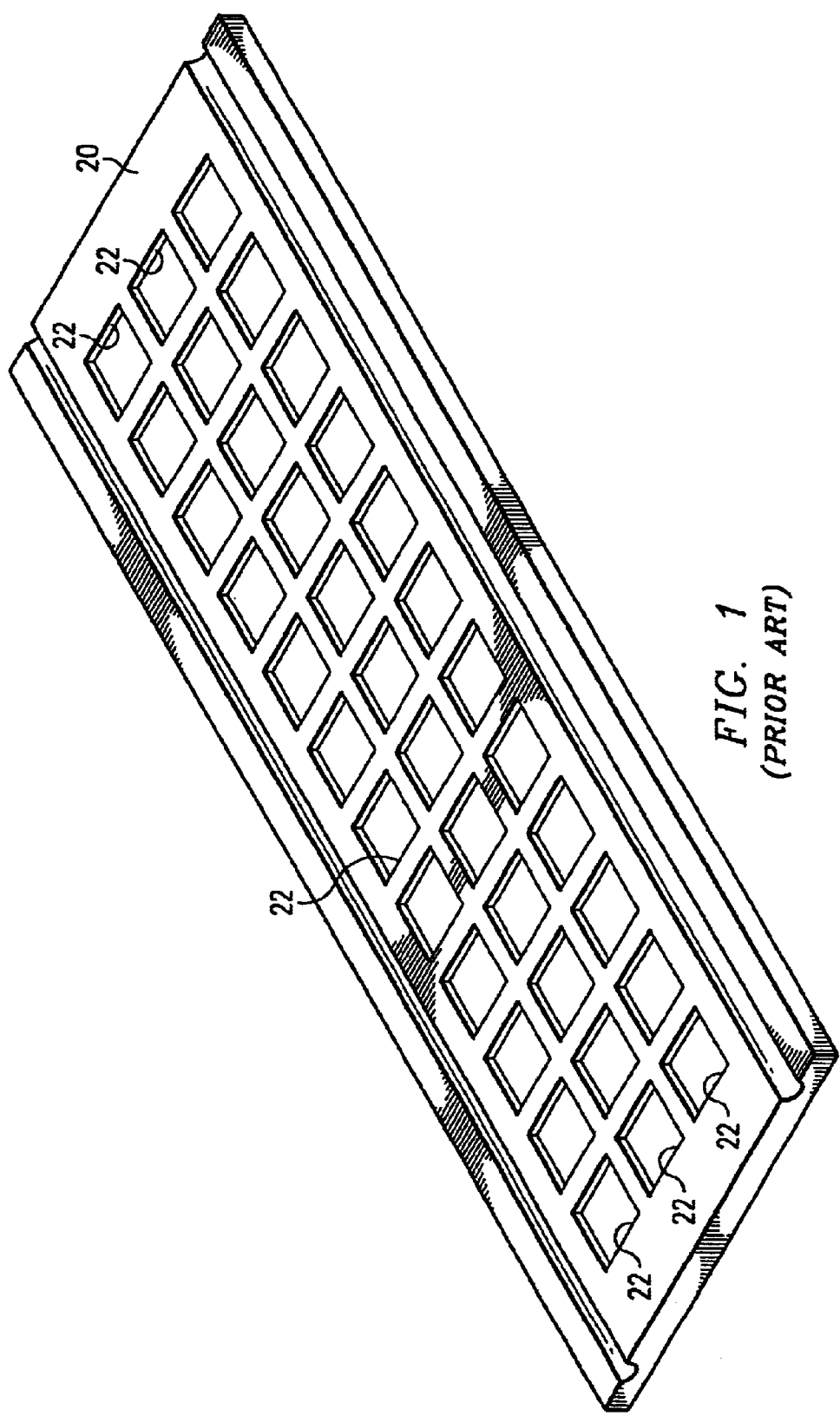
FIG. 1 is a perspective view of a boat from the prior art that is adapted to carry semiconductor chips therein.

Referring now to the drawings, wherein like reference numbers are used herein to designate like elements throughout the various views, a preferred embodiment of the present invention is illustrated and described. The figures are not necessarily drawn to scale, and in some instances the drawings have been exaggerated and/or simplified in places for illustrative purposes only. One of ordinary skill in the art will appreciate the many possible applications and variations of the present invention based on the following description of the preferred embodiment.

Often production line equipment can be further improved and made more reliable to, among other things, reduce production downtime for repairs and/or adjustments in the equipment. An embodiment of the present invention provides such an improvement and has proven to reduce downtime, as well as reducing indexing errors.

Figure 2:
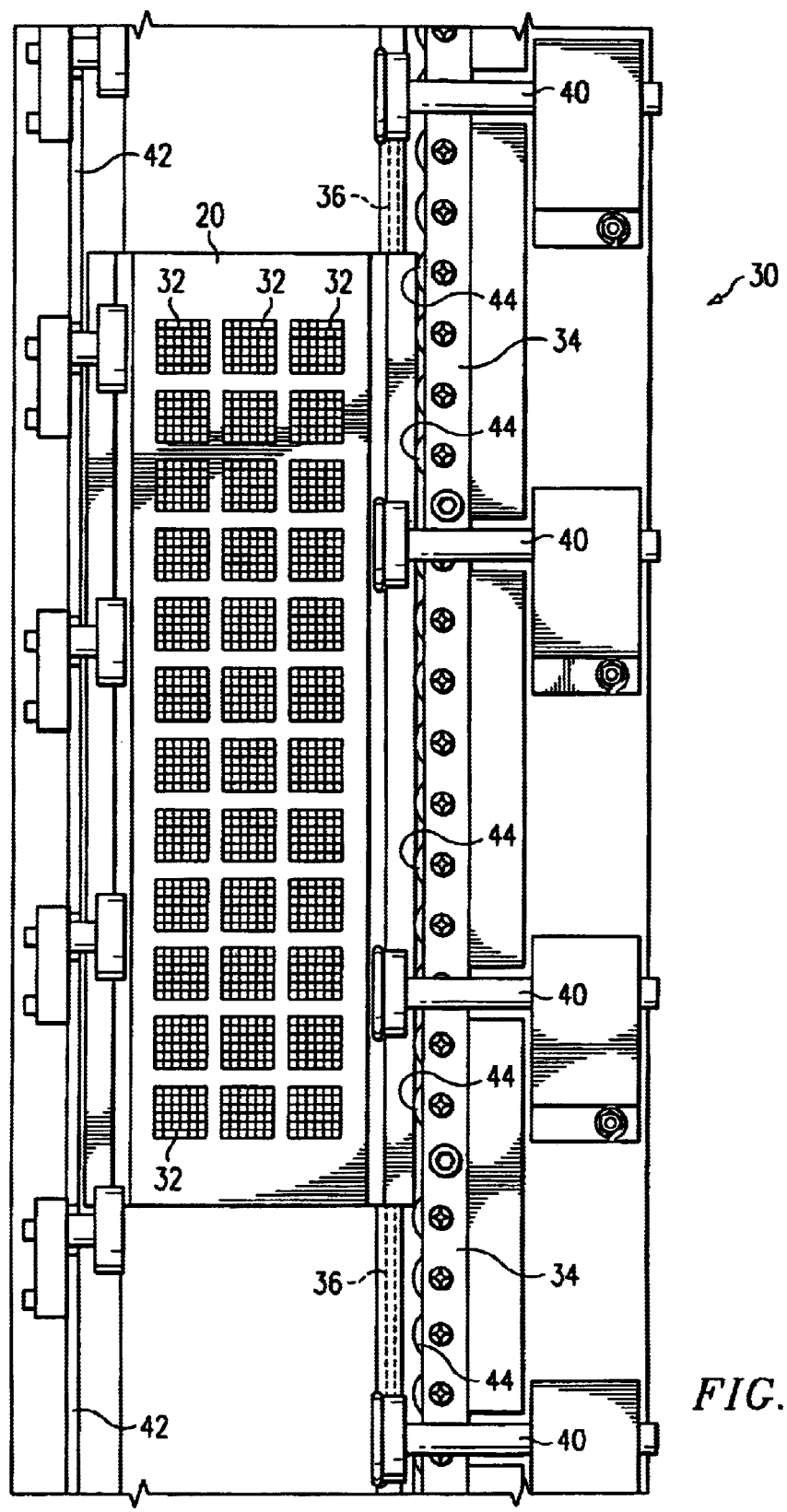
FIG. 2 is a top view of a conveyor system of a preferred embodiment of the present invention.
Figure 3:
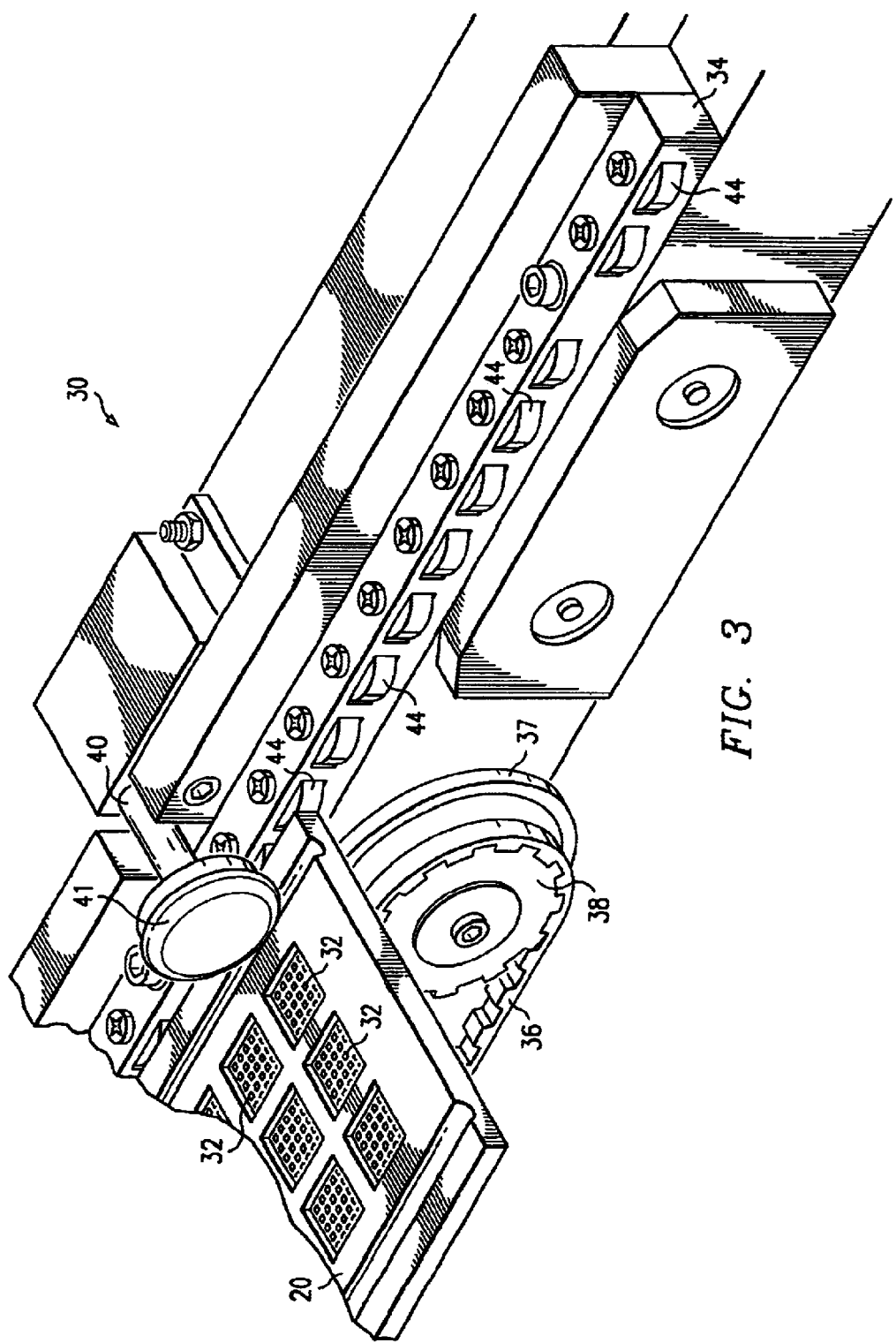
FIG. 3 is a perspective view of the conveyor system of FIG. 2.

The following description and FIGS. 2 and 3 pertain to a preferred embodiment of the present invention. The preferred embodiment is an improved indexing conveyor system 30 used in packaging processes for the production of semiconductor chips 32. FIG. 2 is a top view of the conveyor system 30 of the preferred embodiment. FIG. 3 is a perspective view of the improved front railing 34 of the preferred embodiment.

The conveyor system 30 of the preferred embodiment is part of an Alphasem SL9002 machine used in ball grid array packaging and die attach operations for semiconductor chips 32. Other machines in which the preferred embodiment may be employed will be apparent to one of ordinary skill in the art with the benefit of this disclosure. The conveyor system 30 shown in FIGS. 2 and 3 is adapted to move and transport the boat 20 of FIG. 1 from one process station to the next in an automated production line. For example, at one station the boat 20 may be indexed to positions for dispensing material onto each chip 32 loaded on the boat 20. And at the next station the boat 20 may be indexed to positions for bonding a package onto each chip 32, for example.

As best shown in FIG. 3, a feed belt 36 driven by a feed pulley 38 propels the boat 20 as the feed belt 36 moves about the feed pulleys 38 (only one feed pulley 38 shown in FIG. 3). An o-ring 37 is located on the feed pulley 38 adjacent to the feed belt 36. The boat 20 contacts the o-ring 37 at the feed pulley 38 instead of the feed belt 36. The use of the o-ring 37 here on the feed pulley 38 provides better grip on the boat 20 than the feed belt 36 during index movements, and thus reduces indexing problems and improves indexing accuracy. Also, the use of the o-ring 37 prolongs the life of the feed belt 36, and the o-ring 37 is typically less expensive to replace than the feed belt 36.

A set of lead frame clamp rollers 40 press downward against the boat so that the boat is pressed against the feed belt 36 and/or the o-ring 37 for better traction. Each lead frame clamp roller 40 has an o-ring 41 on its roller to provide a rubber on metal contact instead of a metal on metal contact, which greatly reduces or eliminates wear between the roller 40 and the boat 20. Also, the o-rings 41 are easily and inexpensively replaceable when they wear out. Railings 34, 42 extend along the conveyor system on each side of the boat 20 to direct the path of the boat 20 as it moves along the conveyer system 30.

One of the top machine downtime contributors of the indexing conveyor machines for ball grid array die attach operations is indexing errors or feed system errors. According to test studies, almost 95% of non-productive time for ball grid array die attach operations on an indexing conveyor machine is due to indexing errors or feed system errors. Thus, any improvements that will reduce such indexing errors and feed system errors will likely result in much less non-productive time, which may translate into higher efficiencies and greater profits.

Current indexing conveyor systems used in packaging processes for the production of semiconductor chips are often configured in a way that the boat 20 rubs against the front railing (prior front railing not shown) of the conveyor system 30 as the boat 20 moves from one station to another. Such rubbing may cause additional friction in the system 30, which may result in greater energy requirements to move the boat 20. Also, such rubbing may cause more wear to the boat 20 and/or the front railing. Often such rubbing can cause metal filings to accumulate where the rubbing occurs, which may introduce unwanted contaminates into the production area. Furthermore, such rubbing may prevent the boat 20 from moving smoothly in a continuous manner and with precision of movement, which may lead to indexing errors. When indexing errors exceed an allowable threshold, the production line may need to be shut down to correct the indexing errors.

The inventors of the present invention recognized these rubbing problems contributing to the indexing and feeding errors, and conceived the present invention to address these rubbing problems stated above. As shown in FIGS. 2 and 3, the preferred embodiment of the present invention incorporates a set of bearings 44 coupled to the front railings 34 of the conveyor system 30. Thus as the boat 20 moves along the conveyor system 30, instead of the boat 20 rubbing against the front railing 34, the boat 20 contacts and rolls along the outer surfaces of the bearings 44. Because the boat 20 rolls across the bearings 44 rather than rubbing against the front railing 34, much of the friction between the boat 20 and the front railing 34 is eliminated, the production of metal filings due to friction is reduced or eliminated, the wear on the boat 20 and/or front railing 34 is significantly reduced or eliminated, and the indexing and feeding errors are reduced. As a result, indexing error downtime may be reduced and non-value-added activities may be reduced by use of the preferred embodiment of the present invention.

In another embodiment (not shown), the rear railing 42 may also incorporate a set of bearings to further improve the system 30. However, the addition of bearings on the rear railing 42 becomes an economic issue of comparing the results of the improvements with the cost of the improvements. Thus, in some cases where there are sufficient performance and efficiency gains from merely incorporating a front railing 34 with bearings 44 (as in the preferred embodiment), the preferred embodiment may be the best mode. In other machines or systems (not shown), it may be the best mode to have bearings incorporated in the front and rear railings 34, 42 in accordance with another embodiment of the present invention.

An embodiment of the present invention may be incorporated into an existing system, as in the preferred embodiment described above. In alternative, the present invention may be incorporated into the design of a new machine and provided by a manufacturer of the conveyor system. Hence, there can be many applications of an embodiment of the present invention.

Although only the preferred embodiment is shown herein, one of ordinary skill in the art having the benefit of this disclosure will realize that there may be many other embodiments of the present invention that vary from the preferred embodiment but are still defined by the claims. Thus, it will be appreciated by those skilled in the art having the benefit of this disclosure that an embodiment of the present invention provides an innovative improvement in a railing for a boat conveyor system in a production line. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Therefore, it is intended that the following claims be interpreted to embrace all such further modifications, changes, rearrangements, substitutions, alternatives, design choices, and embodiments.

What is claimed:

1. A conveyor system, comprising:

a boat;

a clamp roller positioned to press down on said boat;

a railing adapted to retain the boat and to define at least part of a path for the boat as it moves along the conveyor system; and a bearing coupled to the railing at a location so that the boat will contact the bearing rather than the railing for at least part of the path as the boat moves along the conveyor system.

2. The system of claim 1, wherein said clamp roller includes an o-ring.

3. A conveyor system, comprising:

a boat adapted to carry a component therein;

a feed belt driven by a feed pulley, the feed belt being adapted to move the boat along the conveyor system;

a clamp roller positioned to press the boat against the feed belt;

railings adapted to retain the boat and to define a path for the boat; and a set of bearings coupled to each of the railings in locations such that the boat will contact the bearings rather than the railings for at least part of the path as the boat moves along the conveyor system.

4. The system of claim 3, further comprising an o-ring located about the feed pulley adjacent to the feed belt, the o-ring being adapted to move the boat along the conveyor system.

5. The system of claim 3, wherein said clamp roller includes an o-ring.

6. A method of producing an electronic component, comprising the steps of:

providing a conveyor system, comprising:

a boat adapted to carry the electronic component therein, a feed belt driven by a feed pulley, the feed belt being adapted to move the boat along the conveyor system, a clamp roller positioned to press the boat against the feed belt;

a railing to retain the boat and to define a path for the boat, and a set of bearings coupled to the railing in locations such that the boat will contact the bearings rather than railing for at least part of the path as the boat moves along the conveyor system;

moving the boat from one location to another location with the feed belt;

clamping said boat against said feed belt with said clamp roller; and directing the path of the boat with the bearings.

7. The method of claim 6 wherein said step of providing a conveyor comprises the step of providing a conveyor with an o-ring located about the feed pulley adjacent to the feed belt, the o-ring being adapted to move the boat along the conveyor system.

8. A conveyor system, comprising:

a boat adapted to carry a component therein;

a feed belt driven by a feed pulley;

a clamp roller positioned to press the boat against the feed belt;

railings adapted to retain the boat and to define a path for the boat; and a set of bearings coupled to each of the railings in locations such that the boat will contact the bearings rather than the railings for at least part of the path as the boat moves along the conveyor system.

9. The system of claim 8, further comprising an o-ring located about the feed pulley adjacent to the feed belt, the o-ring being adapted to move the boat along the conveyor system.

10. The system of claim 8, wherein said clamp roller includes an o-ring.

* * * * *